(12) United States Patent
Vera Villarroel et al.

(10) Patent No.: US 9,882,532 B1
(45) Date of Patent: Jan. 30, 2018

(54) LINEAR AMPLIFIER WITH EXTENDED LINEAR OUTPUT RANGE

(71) Applicant: INPHI CORPORATION, Santa Clara, CA (US)

(72) Inventors: Ariel Leonardo Vera Villarroel, Porter Ranch, CA (US); Subramaniam Shankar, Thousand Oaks, CA (US); Steffen O. Nielsen, Newbury Park, CA (US); Carl Pobanz, Westlake Village, CA (US)

(73) Assignee: INPHI CORPORATION, Santa Clara, CA (US)

( * ) Notice: Subject to any disclaimer, the term of this patent is extended or adjusted under 35 U.S.C. 154(b) by 42 days.

(21) Appl. No.: 15/061,928

(22) Filed: Mar. 4, 2016

(51) Int. Cl.
*H03F 3/45* (2006.01)
*H03F 1/02* (2006.01)

(52) U.S. Cl.
CPC ....... *H03F 1/0222* (2013.01); *H03F 3/45085* (2013.01); *H03F 3/45098* (2013.01); *H03F 3/45071* (2013.01); *H03F 3/45183* (2013.01); *H03F 2200/462* (2013.01); *H03F 2200/471* (2013.01); *H03F 2203/45026* (2013.01); *H03F 2203/45154* (2013.01)

(58) Field of Classification Search
CPC ............... H03F 1/0222; H03F 3/45085; H03F 3/45098; H03F 3/45; H03F 3/45071; H03F 3/45179; H03F 3/45183
USPC .................................................. 330/253–261
See application file for complete search history.

(56) References Cited

U.S. PATENT DOCUMENTS

| | | | |
|---|---|---|---|
| 6,084,472 A | 7/2000 | Gilbert | |
| 7,170,349 B2 * | 1/2007 | Bhattacharjee | H03F 1/42 330/254 |
| 7,199,664 B2 * | 4/2007 | Bult | H01F 17/0006 257/E27.046 |
| 7,259,628 B2 * | 8/2007 | Huang | H03F 3/45183 330/254 |
| 7,456,692 B2 * | 11/2008 | Maruyama | H03F 3/45188 330/254 |
| 8,102,209 B2 * | 1/2012 | Jang | H03F 3/45188 330/254 |
| 8,866,554 B2 * | 10/2014 | Botker | H03F 1/0266 330/258 |

(Continued)

*Primary Examiner* — Khanh V Nguyen
(74) *Attorney, Agent, or Firm* — Richard T. Ogawa; Ogawa P.C.

(57) ABSTRACT

The present disclosure provides a detailed description of techniques for implementing a linear amplifier with extended linear output range. More specifically, the present disclosure discloses techniques for extending the output signal range of a linear amplifier with a minimum increase in power consumption and die area consumption. Some embodiments facilitate coupling boost amplifiers with adjustable independent biasing to a main amplifier to boost the output signal near the non-linear regions of the transfer curve to extend the linear range. Certain embodiments comprise a first boost amplifier biased to contribute to the output signal when the input signal is near a negative threshold voltage, and a second boost amplifier biased to contribute to the output signal when the input signal is near a positive threshold voltage. In certain embodiments, the threshold voltages and/or the bias currents can be controlled to adjust certain amplifier attributes.

18 Claims, 11 Drawing Sheets

(56) References Cited

U.S. PATENT DOCUMENTS

2003/0042973 A1\* 3/2003 Naka ................... H03F 3/45183
　　　　　　　　　　　　　　　　　　　　　　327/563
2005/0147136 A1　　7/2005　Pobanz \* cited by examiner

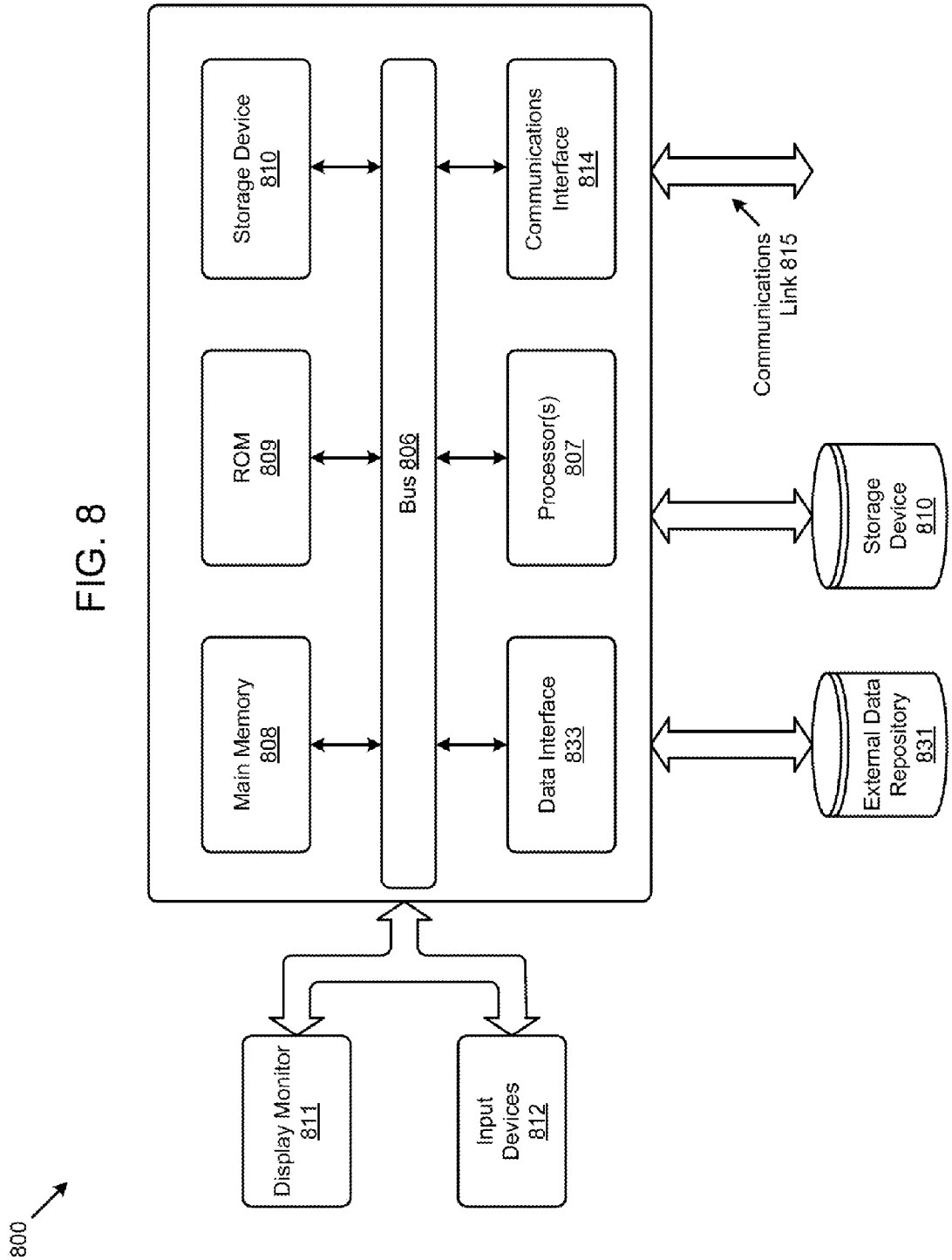

LINEAR AMPLIFIER WITH EXTENDED LINEAR OUTPUT RANGE

FIELD

This disclosure relates to the field of amplifiers and more particularly to techniques for a linear amplifier with extended linear output range.

BACKGROUND

The linear amplifier is a key component in many electronic systems. Specifically, linear amplifiers can be implemented in high-speed communication (e.g., fiber optic) networks and systems. For example, in a fiber optic system, a linear amplifier can be used in a fiber optic transmitter to drive input data signals into a laser modulator stage for conversion to modulated (e.g., using pulse-amplitude modulation or PAM) optical signals. In such applications, the linear amplifier is expected to exhibit accurate (e.g., high linearity, low distortion) amplification of the input data signals over a maximum output signal range. Distortion and/or other non-linear characteristics introduced by the linear amplifier can result in an increase in bit-error-rate (BER) and/or other system performance issues. A limited output signal range can further limit the ability of the fiber optic system to implement higher orders of multi-level signaling (e.g., PAM-16 having 16-level signaling) to accommodate the continually increasing demand for more data bandwidth over a fixed transmission medium.

Unfortunately, legacy approaches to implementing linear amplifiers having the foregoing characteristics can be limited at least as pertains to certain performance aspects. For example, one implementation of a linear amplifier can include a differential pair amplifier with degeneration resistors. With this approach, the output signal linearity degrades at increased output values. The degeneration resistor values can be increased to extend the linear output range, but the degeneration resistor value increase will also reduce the gain. The bias current for the differential pair amplifier can be increased to recover the gain, but the bias current increase will increase the power consumption of the linear amplifier. Other legacy approaches to extending the output signal range of a linear amplifier can further increase die area consumption (e.g., of the integrated circuit implementing the linear amplifier) and/or power consumption.

Techniques are therefore needed to address the problem of implementing techniques for extending the output signal range of a linear amplifier that exhibit a minimum increase in die area consumption and power consumption. None of the aforementioned legacy approaches achieve the capabilities of the herein-disclosed techniques for a linear amplifier with extended linear output range. Therefore, there is a need for improvements.

SUMMARY

The present disclosure provides improved techniques to address the aforementioned issues with legacy approaches. Specifically, the present disclosure provides a detailed description of techniques for implementing a linear amplifier with extended linear output range. The claimed embodiments address the problem of implementing techniques for extending the output signal range of a linear amplifier that exhibit a minimum increase in die area consumption and power consumption.

More specifically, some embodiments of the present disclosure are directed to approaches for coupling boost amplifiers with adjustable independent biasing to a main amplifier at the output to boost the output signal near the non-linear regions of the transfer curve to extend the linear range. In one or more embodiments, a first boost amplifier is biased to contribute to the output signal when the input signal is near a negative threshold voltage, while a second boost amplifier is biased to contribute to the output signal when the input signal is near a positive threshold voltage. In some embodiments, the bias currents for the boost amplifiers are related to the bias current for the main amplifier by a scaling factor. In certain embodiments, the threshold voltages and/or the bias currents can be controlled to adjust the amplifier linear output range (e.g., after fabrication).

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure.

FIG. 8 depicts a block diagram of an instance of a computer system suitable for implementing embodiments of the present disclosure.

DETAILED DESCRIPTION

Figure 1:
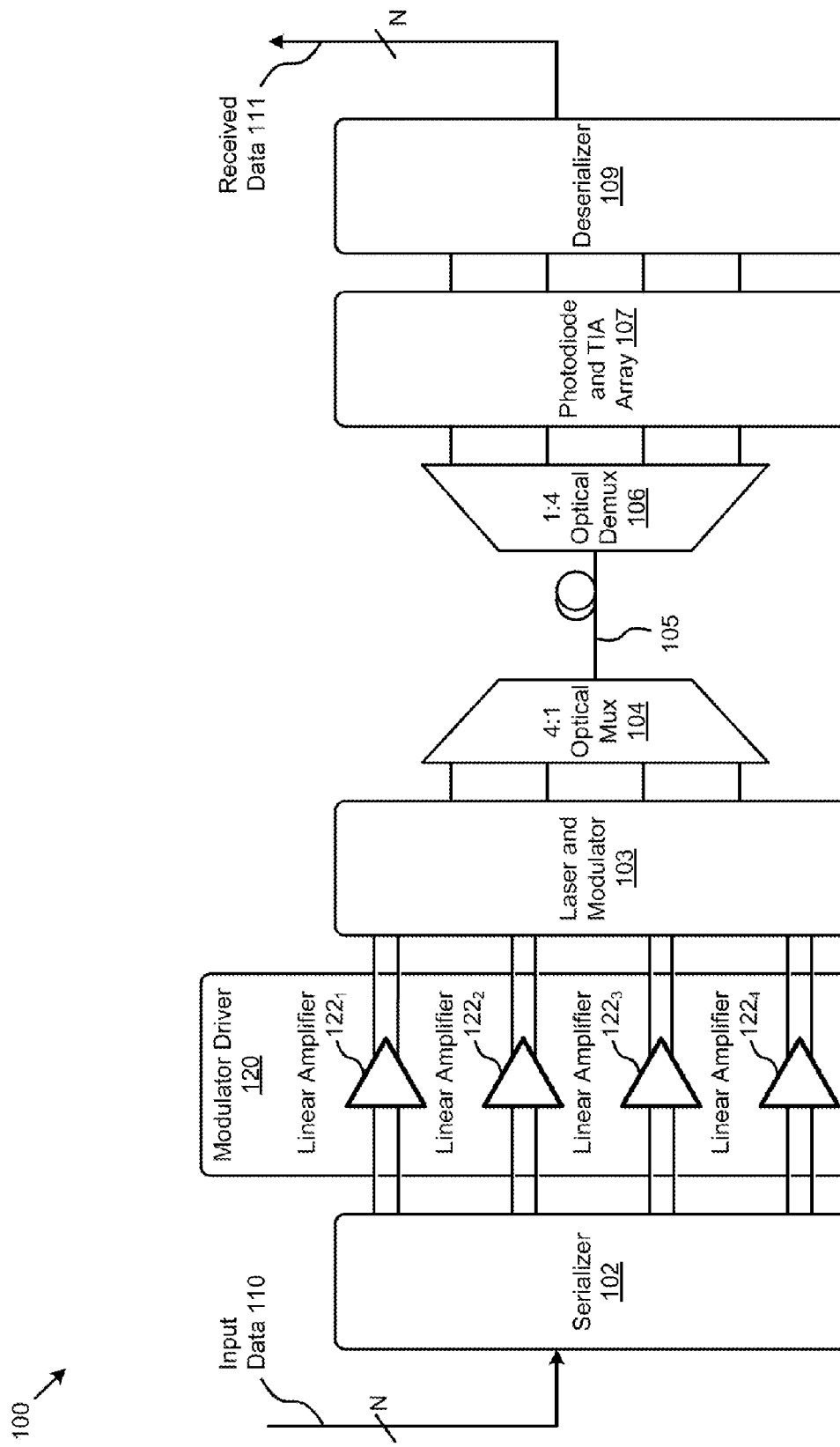
FIG. 1 depicts an environment that includes linear amplifiers.

Some embodiments of the present disclosure address the problem of implementing techniques for extending the output signal range of a linear amplifier that exhibit a minimum increase in die area consumption and power consumption, and some embodiments are directed to approaches for coupling boost amplifiers with adjustable independent biasing to a main amplifier at the output to boost the output signal near the non-linear regions of the transfer curve to extend the linear range. More particularly, disclosed herein and in the accompanying figures are exemplary environments, methods, and systems for linear amplifier with extended linear output range.

OVERVIEW

The linear amplifier is a key component in many electronic systems. Specifically, linear amplifiers with a wide linear output range can be implemented in high-speed communication (e.g., fiber optic) networks and systems. Unfortunately, legacy approaches to implementing linear amplifiers with a wide linear output range for such networks and systems can be limited at least as pertains to certain performance aspects. For example, some legacy approaches use a degenerated differential pair amplifier that can be configured to extend the linear output range of the amplifier, but at an increased power consumption level. Other legacy approaches to extending the output signal range of a linear amplifier can further increase die area consumption (e.g., of the integrated circuit implementing the linear amplifier) and/or power consumption.

Some embodiments of the present disclosure address the problem of implementing techniques for extending the output signal range of a linear amplifier that exhibit a minimum increase in die area consumption and power consumption. More specifically, the techniques disclosed herein provide an amplifier having boost amplifiers with adjustable independent biasing coupled to a main amplifier at the output to boost the output signal near the non-linear regions of the transfer curve to extend the linear range. In one or more embodiments, a first boost amplifier is biased to contribute to the output signal when the input signal is near a negative threshold voltage, while a second boost amplifier is biased to contribute to the output signal when the input signal is near a positive threshold voltage. In some embodiments, the bias currents for the boost amplifiers are related to the bias current for the main amplifier by a scaling factor. In certain embodiments, the threshold voltages and/or the bias currents can be controlled to adjust the amplifier linear output range (e.g., after fabrication).

Definitions

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

DESCRIPTIONS OF EXEMPLARY EMBODIMENTS

FIG. 1 depicts an environment 100 that includes linear amplifiers. As an option, one or more instances of environment 100 or any aspect thereof may be implemented in the context of the architecture and functionality of the embodiments described herein. Also, the environment 100 or any aspect thereof may be implemented in any desired environment.

As shown in FIG. 1, the environment 100 illustrates an environment in which the herein disclosed techniques for a linear amplifier with extended linear output range can be implemented. Specifically, the environment 100 illustrates the high order components of a fiber optic communications system including one or more linear amplifiers. For example, the components in environment 100 can represent a 100 GbE LR4 system. The environment 100 might also be representative of other systems in a variety of environments and applications, such as non-optical serial data communication links and memory data interfaces. Specifically, the environment 100 comprises a serializer 102, a modulator driver 120, a laser and modulator 103, a 4:1 optical mux 104, a fiber optic link 105, a 1:4 optical demux 106, a photodiode and TIA array 107, and a deserializer 109. The modulator driver 120 further comprises a plurality of linear amplifiers (e.g., linear amplifier $122_1$, linear amplifier $122_2$, linear amplifier $122_3$, and linear amplifier $122_4$. As shown in FIG. 1, the linear amplifiers can receive differential input signals from the serializer 102 to produce differential output signals for the laser and modulator 103. In other systems, any number of linear amplifiers and/or any signaling configuration can be used. The environment 100 further illustrates that parallel (e.g., N wide) input data 110 is received by serializer 102 and converted to a serial data stream having four channels (e.g., for LR4). The electrical signals comprising each channel of serial data are then amplified by a respective linear amplifier for the laser and modulator 103 to be converted to modulated (e.g., PAM-xx, QPSK, etc.) optical signals. The four channels are multiplexed into one channel by 4:1 optical mux 104 and delivered to the fiber optic link 105. The optical signal is received by 1:4 optical demux 106 and demultiplexed to four channels and delivered to photodiode and TIA array 107. The photodiode and TIA array 107 convert the current signals (e.g., through the photodiodes) to voltage signals to be received by deserializer 109. Deserializer 109 then converts the four channels of serial data to parallel (e.g., N wide) received data 111.

The plurality of linear amplifiers are an important component of systems such as shown in environment 100 in that they provide an accurate (e.g., high linearity, low distortion) representation of the input data 110 to facilitate, for example, higher orders of multi-level modulation (e.g., PAM-16) implemented at the laser and modulator 103. Linear amplifiers can facilitate such techniques, in part, by having a wide linear output range. However, legacy approaches to extending the linear output range can also increase power consumption and/or die area consumption, which can be undesirable in systems and networks such as illustrated in environment 100. The herein disclosed techniques can address the problems attendant to extending the output signal range of a linear amplifier while exhibiting a minimum increase in die area consumption and power consumption. Such techniques are described in more detail as pertains to FIG. 2.

Figure 2:
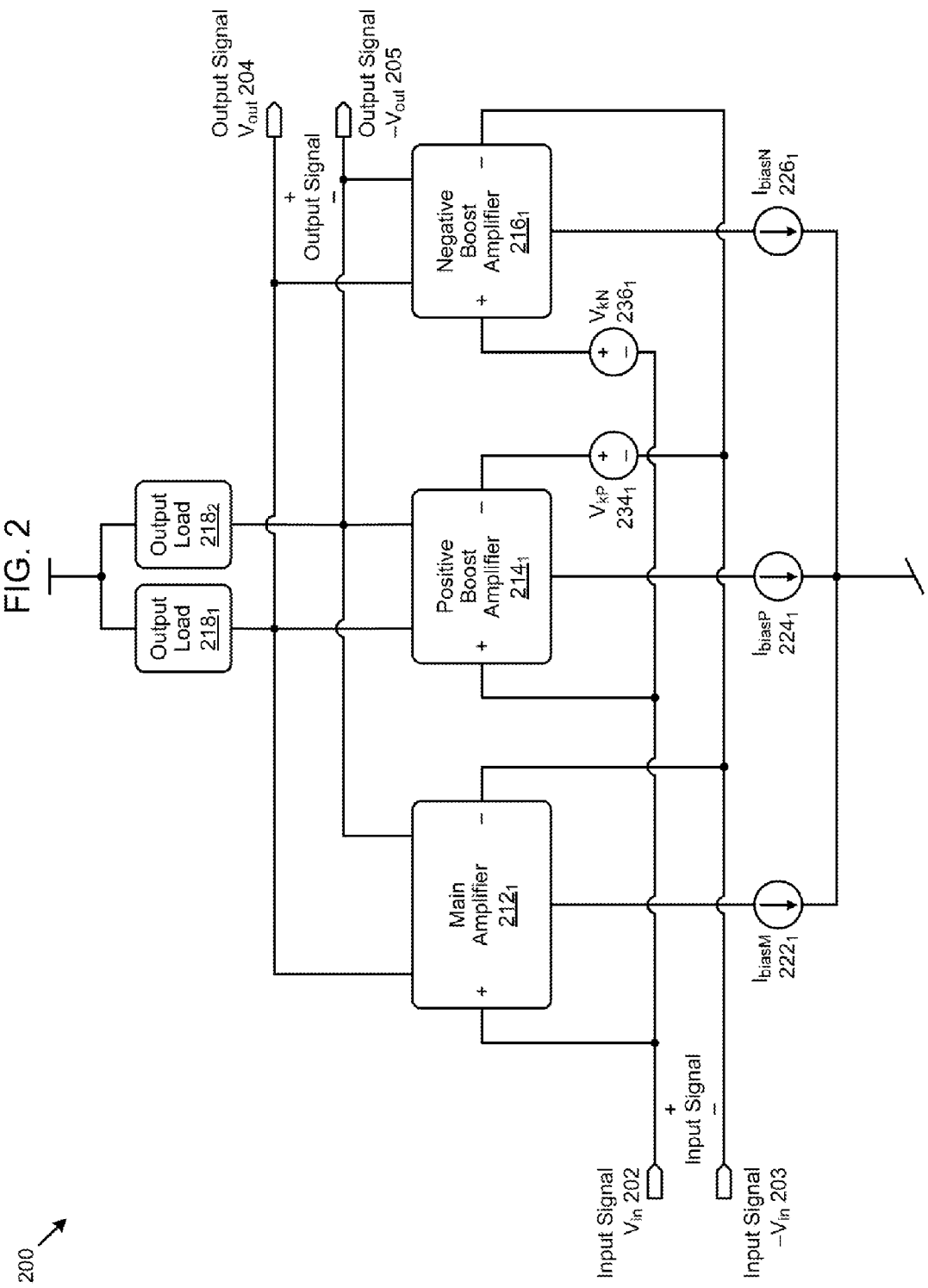
FIG. 2 is a diagrammatic representation of a linear output range extension technique as used to implement a linear amplifier with extended linear output range, according to an embodiment.

FIG. 2 is a diagrammatic representation of a linear output range extension technique 200 as used to implement a linear amplifier with extended linear output range. As an option, one or more instances of linear output range extension technique 200 or any aspect thereof may be implemented in the context of the architecture and functionality of the embodiments described herein. Also, the linear output range extension technique 200 or any aspect thereof may be implemented in any desired environment.

As shown in FIG. 2, the linear output range extension technique 200 depicts a differential linear amplifier receiving a different input signal characterized by an input signal $V_{in}$ 202 and an input signal $-V_{in}$ 203 to produce an output signal characterized by an output signal $V_{out}$ 204 and an output signal $-V_{out}$ 205. For example, the input signal can be the difference between the input signal $V_{in}$ 202 and the input signal $-V_{in}$ 203. Further, the output signal can be the difference between the output signal $V_{out}$ 204 and the output signal $-V_{out}$ 205. As shown, the differential linear amplifier can comprise a main amplifier 212$_1$, a positive boost amplifier 214$_1$, and a negative boost amplifier 216$_1$, all coupled in parallel to provide the output signal. In one or more embodiments, the linear output range extension technique 200 can use the main amplifier 212$_1$ as the primary driver of the output signal, while the positive boost amplifier 214$_1$ and the negative boost amplifier 216$_1$ can be used to extend the linear range (e.g., for positive input signals and negative input signals, respectively) of the output signal transfer characteristic provided by the main amplifier 212$_1$. Specifically, such contributions to the output signal $V_{out}$ 204 and the output signal $-V_{out}$ 205 can be determined by the portion of the amplifier bias currents (e.g., $I_{biasM}$ 222$_1$ for the main amplifier 212$_1$, $I_{biasP}$ 224$_1$ for the positive boost amplifier 214$_1$, and $I_{biasN}$ 226$_1$ for the negative boost amplifier 216$_1$) passing through the amplifiers and into an output load 218$_1$ and an output load 218$_2$, respectively. For example, in one embodiment, $I_{biasM}$ 222$_1$ might be 90% of a total bias current $I_{bias}$ (e.g., corresponding to a design power budget for the differential linear amplifier), while $I_{biasP}$ and $I_{biasN}$ might each be 5% of $I_{bias}$. In certain embodiments, $I_{biasP}$ and/or $I_{biasN}$ can be related to $I_{biasM}$ by other scaling factors.

As shown, the positive terminal (e.g., "+" terminal) and negative terminal (e.g., "−" terminal) of the main amplifier 212$_1$ can be coupled directly to the input signal $V_{in}$ 202 and coupled directly to the input signal $-V_{in}$ 203, respectively, to contribute a portion of the output signal corresponding to the magnitude of $I_{biasM}$ 222$_1$ (e.g., 90% • $I_{bias}$). In this case, the transfer function of the main amplifier 212$_1$ can be symmetric near:

$$V_{in}-(-V_{in})=0 \quad [\text{EQ. 1}]$$

Further, the positive terminal and negative terminal of the positive boost amplifier 214$_1$ can be coupled directly to the input signal $V_{in}$ 202 and coupled through a voltage source (e.g., $V_{kP}$ 234$_1$) to the input signal $-V_{in}$ 203, respectively, to contribute a portion of the output signal corresponding to the magnitude of $I_{biasP}$ 224$_1$ (e.g., 5% • $I_{bias}$). In this case, the transfer function of the positive boost amplifier 214$_1$ can be symmetric near:

$$V_{in}-(-V_{in})=+V_{kP} \quad [\text{EQ. 2}]$$

Also, the positive terminal and negative terminal of the negative boost amplifier 216$_1$ can be coupled through a voltage source (e.g., $V_{kN}$ 236$_1$) to the input signal $V_{in}$ 202 and coupled directly to the input signal $-V_{in}$ 203, respectively, to contribute a portion of the output signal corresponding to the magnitude of $I_{biasN}$ 226$_1$ (e.g., 5% • $I_{bias}$). In this case, the transfer function of the negative boost amplifier 216$_1$ can be symmetric near:

$$V_{in}-(-V_{in})=-V_{kN} \quad [\text{EQ. 3}]$$

The foregoing characteristics of the linear output range extension technique 200 indicate that the linear range of the output signal provided by the main amplifier 212$_1$ can be extended by the positive boost amplifier 214$_1$ when the input signal is near and/or greater than $V_{kP}$ 234$_1$, and by the negative boost amplifier 216$_1$ when the input signal is near and/or less than $V_{kN}$ 236$_1$. In some cases, the configuration and bias currents for the boost amplifiers can be equivalent (e.g., $I_{biasP}=I_{biasN}$) such that the respective output signal contributions of the boost amplifiers offset one another when the input signal is greater than $-V_{kN}$ and less than $+V_{kP}$ to yield no effective output signal contribution for that input signal range (e.g., the output signal is determined by the main amplifier 212$_1$).

Such output signal boosts facilitated by the linear output range extension technique 200 can serve to extend the linear range of the differential linear amplifier while minimizing any increases in power consumption. For example, the linear output range extension technique 200 can extend the linear range using bias currents having a combined total bias current $I_{bias}$ that can remain within a total bias current budget (e.g., $I_{bias}=25$ mA) for a given application (e.g., a fiber optic communication system). The linear output range extension technique 200 can further be implemented as an integrated circuit with a minimal increase in die area (e.g., as compared to the die area consumed by a linear amplifier with no linear range extension). One embodiment of an implementation of the linear output range extension technique 200 having the foregoing characteristics is illustrated in FIG. 3.

Figure 3:
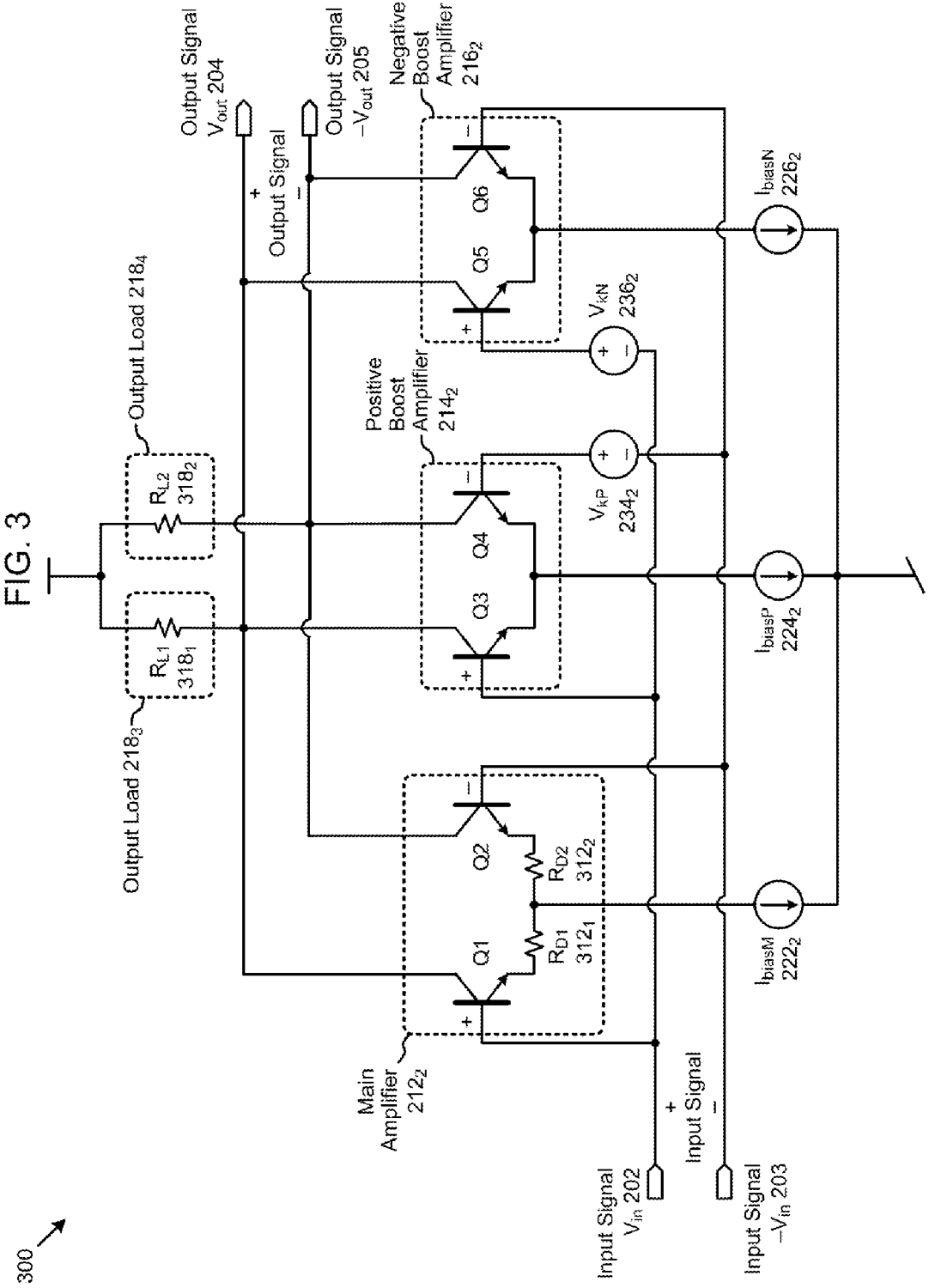
FIG. 3 is a schematic of a linear amplifier with extended linear output range, according to an embodiment.

FIG. 3 is a schematic of a linear amplifier 300 with extended linear output range. As an option, one or more instances of linear amplifier 300 or any aspect thereof may be implemented in the context of the architecture and functionality of the embodiments described herein. Also, the linear amplifier 300 or any aspect thereof may be implemented in any desired environment.

The linear amplifier 300 depicts one embodiment of an implementation of a linear amplifier with extended linear output range according to the herein disclosed techniques. Specifically, certain components and/or attributes of the linear output range extension technique 200 discussed in FIG. 2 are shown with further implementation details, according to one or more embodiments. More specifically, an instance of the main amplifier 212$_2$ is shown comprising a degenerated differential pair having two bipolar junction transistors (e.g., Q1 and Q2) with respective degeneration resistors (e.g., $R_{D1}$ 312$_1$ and $R_{D2}$ 312$_2$, respectively). Other devices (e.g., CMOS devices) are possible. For example, the value of each of $R_{D1}$ 312$_1$ and $R_{D2}$ 312$_2$ might be 15 ohms.

A bias current of $I_{biasM}$ 222$_2$ for the main amplifier 212$_2$ is also shown. The bias current of $I_{biasM}$ 222$_2$ can be designed and/or adjusted based on the target voltage range of the output signal for the linear amplifier 300. As an example, a target differential 2.5 V swing across a 100 ohm resistive output load (e.g., an output load 218$_3$ of $R_{L1}$ 318$_1$=50 ohm, and an output load 218$_4$ of $R_{L2}$ 318$_2$=50 ohm) might implement an approximate total bias current $I_{bias}$ for the linear amplifier 300 of 25 mA. In such cases, the bias current of $I_{biasM}$ 222$_2$ for the main amplifier 212$_2$ might be designed and/or adjusted to be 22.5 mA (e.g., 90% of $I_{bias}$) to contribute the majority portion of the output signal.

As also shown in FIG. 3, an instance of the positive boost amplifier 214$_2$ can comprise a differential pair having two bipolar junction transistors (e.g., Q3 and Q4). Other devices (e.g., CMOS devices) are possible. A bias current of $I_{biasP}$ 224$_2$ for the positive boost amplifier 214$_2$ is also shown. Further, an instance of the negative boost amplifier 216$_2$ can also comprise a differential pair having two bipolar junction transistors (e.g., Q5 and Q6). Other devices (e.g., CMOS devices) are possible. The negative boost amplifier 216$_2$ can have a bias current of $I_{biasN}$ 226$_2$. Other devices and/or configurations for the foregoing amplifiers are possible. In the foregoing example where $I_{biasM}$ 222$_2$ is 22.5 mA of a total bias current budget of 25 mA, $I_{biasP}$ 224$_2$ and $I_{biasN}$ 226$_2$ might be designed and/or adjusted to each be 1.25 mA (e.g., to split the remaining 10% of the total bias current budget). The linear amplifier 300 further comprises an instance of $V_{kP}$ 234$_2$ coupled to the negative terminal of the positive boost amplifier 214$_2$ and an instance of $V_{kN}$ 236$_2$ coupled to the positive terminal of the negative boost amplifier 216$_2$. In some cases, the value of each of $V_{kP}$ 234$_2$ and $V_{kN}$ 236$_2$ might be 500 mV. Other values for $V_{kP}$ 234$_2$ and $V_{kN}$ 236$_2$ are possible by design and/or adjustment, as described herein.

The herein disclosed techniques implemented in the linear amplifier 300 can facilitate extending the linear output signal range while exhibiting a minimum increase in power consumption and die area consumption. Specifically, the linear output signal range of a legacy linear amplifier having a given bias current budget (e.g., corresponding to an overall amplifier power budget) can be extended by allocating to a main amplifier (e.g., main amplifier 212$_2$) a portion (e.g., 90%) of the bias current budget, and allocating equally to a positive boost amplifier (e.g., positive boost amplifier 214$_2$) and a negative boost amplifier (e.g,. negative boost amplifier 216$_2$) the remaining portion (e.g., 10%) of the bias current budget. The positive boost amplifier and the negative boost amplifier can be configured (e.g., by designing and/or adjusting instances of $V_{kP}$ 234$_2$ and $V_{kN}$ 236$_2$) to boost the output signal near a positive non-linear region of the output signal and a negative non-linear region of the output signal, respectively. In such cases, the linear output signal range can be extended using the given bias current budget, resulting in a minimum increase in power consumption over the legacy implementation.

Further, in some embodiments, the herein disclosed techniques can be implemented in an integrated circuit exhibiting a minimum increase in die area consumption as compared to legacy linear amplifiers. Specifically, for example, the linear amplifier 300 shows an implementation comprising merely four solid state devices (e.g., Q3, Q4, Q5, and Q6) to form the positive boost amplifier 214$_2$ and the negative boost amplifier 216$_2$. Also, for example, the bias current sources providing $I_{biasP}$ and $I_{biasN}$ might be current mirrors (e.g., referenced to $I_{biasM}$ 222$_2$) consuming minimal die area. Also, the voltage sources providing $V_{kP}$ and $V_{kN}$ might be implemented in a shared power management resource for a system comprising a plurality of linear amplifiers.

As discussed as pertains to FIG. 3 and throughout, the herein disclosed techniques are enabled, in part, by the contribution to the output signal from the boost amplifiers. In some cases, such contribution by the boost amplifiers to the output signal can be controlled (e.g., by $V_{kP}$ 234$_2$ and/or $V_{kN}$ 236$_2$). Further details pertaining to the output signal contribution response curves associated with the boost amplifiers are depicted in FIG. 4A.

Figure 4A:
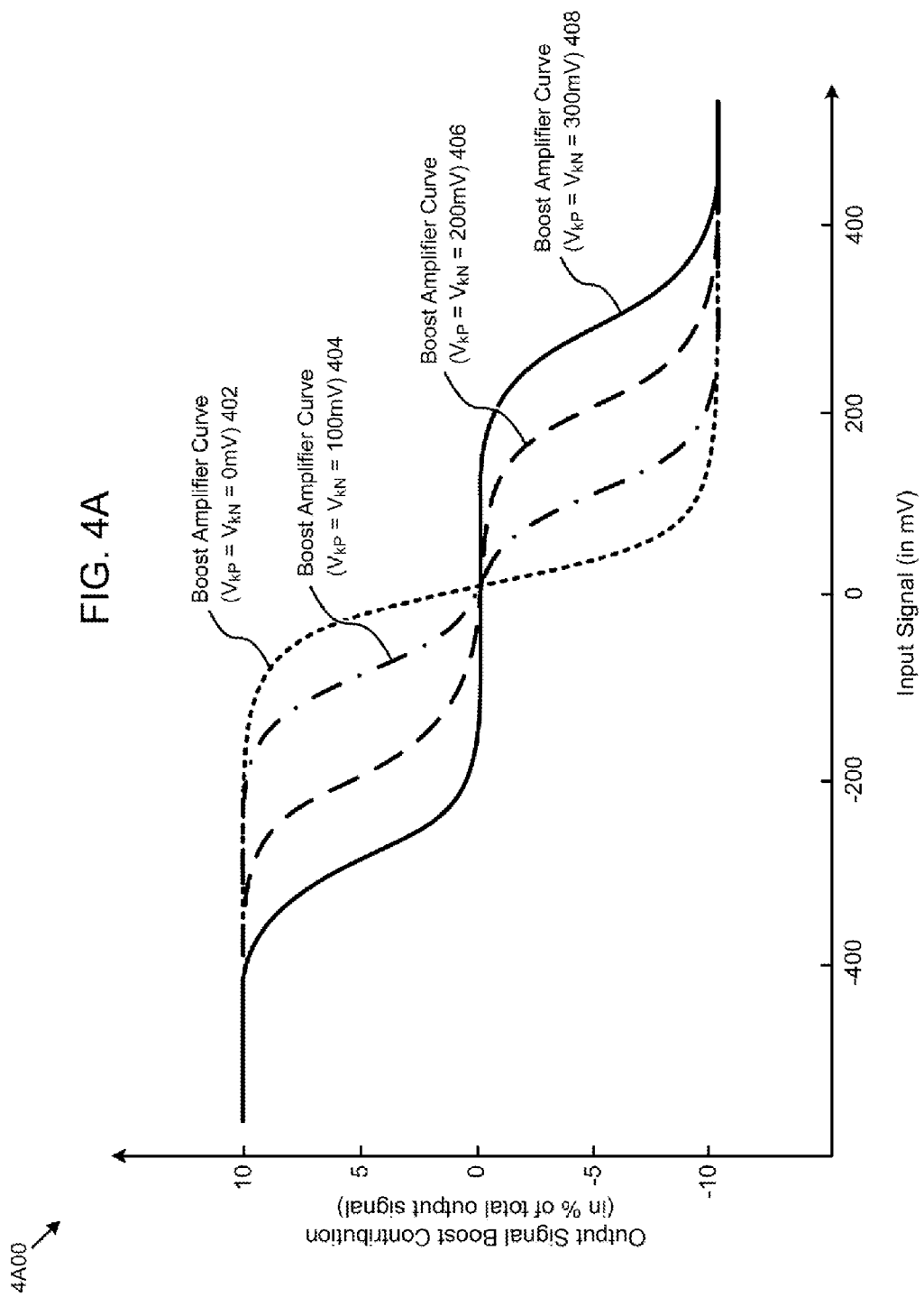
FIG. 4A depicts selected waveforms showing range control response curves in a linear amplifier with extended linear output range, according to an embodiment.

FIG. 4A depicts selected waveforms showing range control response curves 4A00 in a linear amplifier with extended linear output range. As an option, one or more instances of range control response curves 4A00 or any aspect thereof may be implemented in the context of the architecture and functionality of the embodiments described herein. Also, the range control response curves 4A00 or any aspect thereof may be implemented in any desired environment.

As shown in FIG. 4A, the range control response curves 4A00 illustrate a simulated output signal boost contribution response (e.g., in % of the total output signal) to varying input signals (e.g., in mV) in linear amplifiers with extended linear output range implemented according to the herein disclosed techniques. For example, the range control response curves 4A00 can depict the combined output signal boost contribution response from the positive boost amplifier 214$_2$ having a threshold voltage of $V_{kP}$ 234$_2$ and the negative boost amplifier 216$_2$ having a threshold voltage of $V_{kN}$ 236$_2$ described in FIG. 3. The range control response curves 4A00 can further correspond to a positive boost amplifier and a negative boost amplifier each biased to contribute a respective maximum of 5% of the total output signal.

Specifically, the range control response curves 4A00 present a boost amplifier curve with $V_{kP}$=$V_{kN}$=0 mV (see curve 402). In this case, the positive boost amplifier and the negative boost amplifier share a common input offset voltage (e.g., 0 mV) such that the contributions from the boost amplifiers constructively add across all input signals to form the shown curve. When $V_{kP}$ and/or $V_{kN}$ are non-zero, certain portions of the contributions from the positive boost amplifier and the negative boost amplifier might be constructively added for certain input signal ranges, while other portions of the contributions from the positive boost amplifier and the negative boost amplifier might be destructively added for other input signal ranges. For example, the range control response curves 4A00 show a boost amplifier curve with $V_{kP}$=$V_{kN}$=300 mV (see curve 408). In this case, the contribution response from the positive boost amplifier is symmetric about an input offset of +300 mV, and the contribution response from the negative boost amplifier is symmetric about an input offset of −300 mV. In such cases, an output signal boost for input signals near and above +300 mV and an output signal boost for input signals near and below −300 mV is provided as shown. Further, in this case, the contribution from the positive boost amplifier and the negative boost amplifier near 0 mV cancel one another. A boost amplifier curve with $V_{kP}$=$V_{kN}$=100 mV (see curve 404) and a boost amplifier curve with $V_{kP}$=$V_{kN}$=200 mV (see curve 406) are also shown for reference.

Figure 4B:
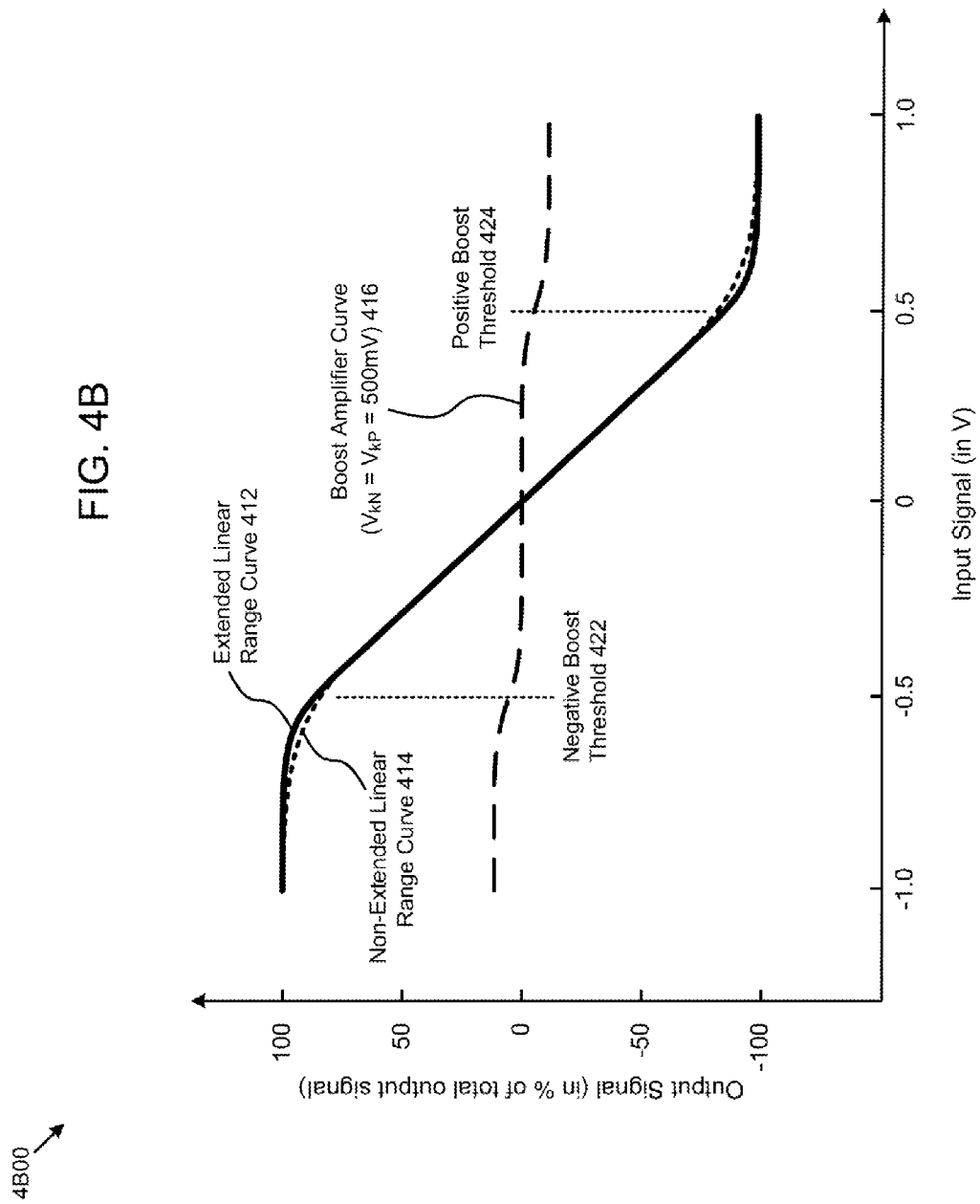
FIG. 4B presents selected waveforms showing a linear range extension characteristic of a linear amplifier with extended linear output range, according to an embodiment.

The effect of such output signal boost contributions according to the herein disclosed techniques is illustrated in FIG. 4B.

FIG. 4B depicts selected waveforms showing a linear range extension characteristic 4B00 of a linear amplifier with extended linear output range. As an option, one or more instances of linear range extension characteristic 4B00 or any aspect thereof may be implemented in the context of the architecture and functionality of the embodiments described herein. Also, the linear range extension characteristic 4B00 or any aspect thereof may be implemented in any desired environment.

As shown in FIG. 4B, the linear range extension characteristic 4B00 illustrates a simulated output signal response (e.g., in % of the total output signal) to varying input signals (e.g., in V) in linear amplifiers with extended linear output range implemented according to the herein disclosed techniques. Also shown in FIG. 4B is a simulated output signal response to varying input signals in a representative legacy linear amplifier. Specifically, an extended linear range curve 412 representing the response from linear amplifiers implemented according to the herein disclosed techniques can be compared to a non-extended linear range curve 414 representing the response of legacy linear amplifiers. More specifically, the transfer characteristic depicted by the extended linear range curve 412 remains more linear as compared to the non-extended linear range curve 414 as the input signal approaches +0.5 V and −0.5 V. This linear range extension is enabled, in part, by the boost amplifiers disclosed herein. Specifically, a boost amplifier curve with $V_{kP}=V_{kN}=500$ mV (see curve 416) is shown in FIG. 4B for reference. For example, the shown boost amplifier curve might correspond to a positive boost amplifier and a negative boost amplifier comprising a linear amplifier with extended linear output range that produced the extended linear range curve 412. In this case, the positive boost amplifier can provide a boost contribution near a positive boost threshold 424 (e.g., +0.5 V or +500 mV) and the negative boost amplifier can provide a boost contribution near a negative boost threshold 422 (e.g., −0.5 V or −500 mV).

One benefit of the extended linear range facilitated by the herein disclosed techniques is an improvement in total harmonic distortion (THD) across the output signal range. Such THD improvements are described as pertains to FIG. 4C.

Figure 4C:
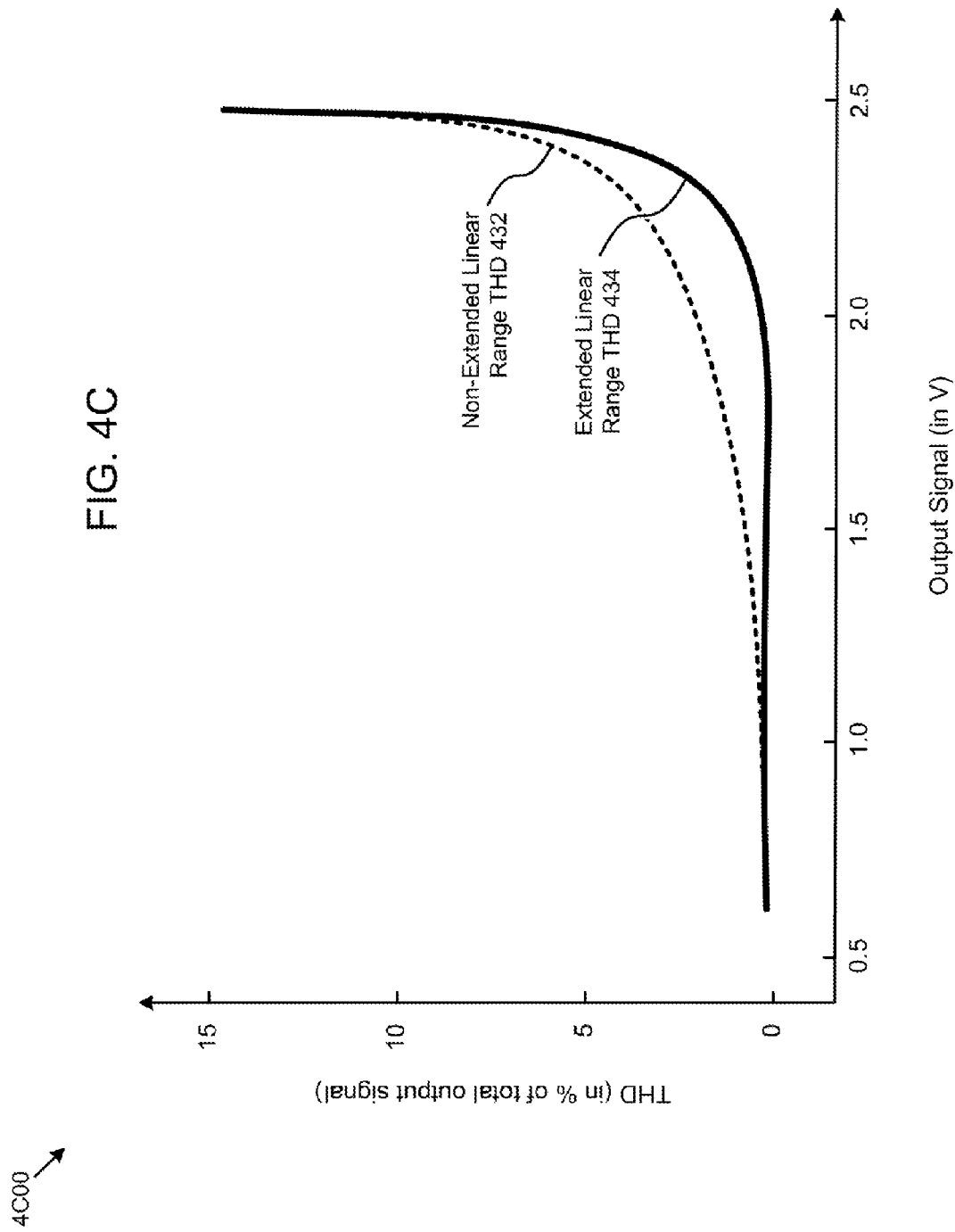
FIG. 4C depicts selected waveforms showing total harmonic distortion improvements of a linear amplifier with extended linear output range, according to an embodiment.

FIG. 4C depicts selected waveforms showing a total harmonic distortion characteristic 4C00 of a linear amplifier with extended linear output range. As an option, one or more instances of total harmonic distortion characteristic 4C00 or any aspect thereof may be implemented in the context of the architecture and functionality of the embodiments described herein. Also, the total harmonic distortion characteristic 4C00 or any aspect thereof may be implemented in any desired environment.

As shown in FIG. 4C, the total harmonic distortion characteristic 4C00 illustrates a simulated THD response (e.g., in % of the total output signal) to varying output signals (e.g., in V) in linear amplifiers with extended linear output range implemented according to the herein disclosed techniques. Also shown in FIG. 4C is a simulated THD response to varying output signals in a representative legacy linear amplifier. Specifically, an extended linear range THD 434 representing the THD of linear amplifiers implemented according to the herein disclosed techniques can be compared to a non-extended linear range THD 432 representing the THD of legacy linear amplifiers. More specifically, the level of the extended linear range THD 434 remains near the THD minimum beyond an output signal of 2.0 V, while the level of the non-extended linear range THD 432 might have exceeded a tolerance level (e.g., THD<1%) near the output signal of 2.0 V.

As discussed herein, the threshold voltages, bias currents, and/or other controlled attributes of the implementations of the herein disclosed techniques might be adjusted to maximize the foregoing THD improvements and/or other performance enhancements exhibited by certain linear amplifiers with extended linear output range. In some cases, adjustment and/or control techniques can be used to compensate for variations in the manufacturing process (e.g., fabrication) of various implementations of such linear amplifiers with extended linear output range. An embodiment of such control techniques is discussed as pertaining to FIG. 5A.

Figure 5A:
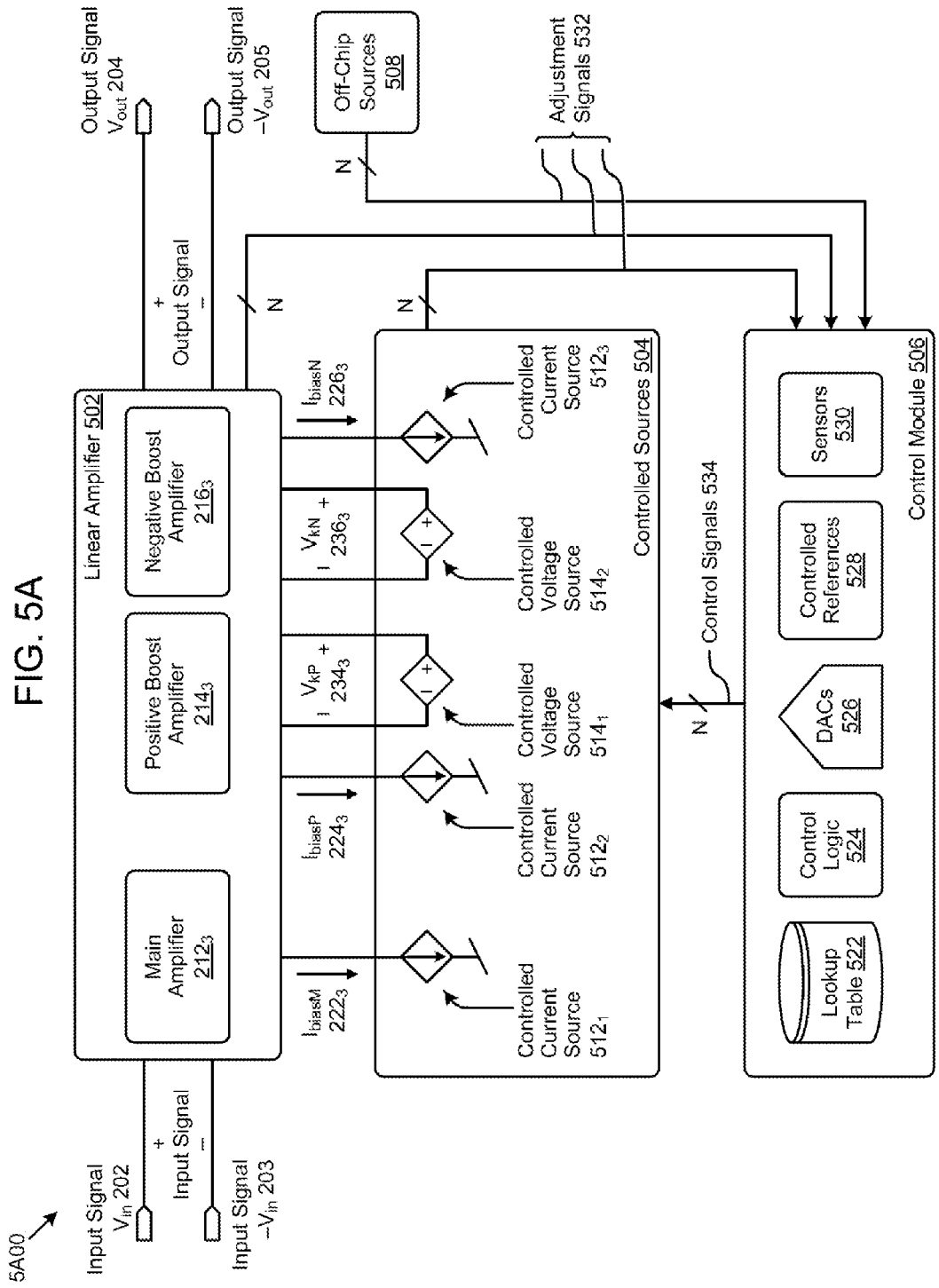
FIG. 5A is a schematic of a linear range extension control technique as used to implement a linear amplifier with extended linear output range, according to an embodiment.

FIG. 5A is a schematic of a linear range extension control technique 5A00 as used to implement a linear amplifier with extended linear output range. As an option, one or more instances of linear range extension control technique 5A00 or any aspect thereof may be implemented in the context of the architecture and functionality of the embodiments described herein. Also, the linear range extension control technique 5A00 or any aspect thereof may be implemented in any desired environment.

As shown in FIG. 5A, the linear range extension control technique 5A00 comprises a linear amplifier 502 implemented according to the herein disclosed techniques for receiving an input signal to produce an output signal. The linear amplifier 502 further comprises a main amplifier $212_3$ having an associated bias current of $I_{biasM}$ $222_3$, a positive boost amplifier $214_3$ having an associated bias current of $I_{biasP}$ $224_3$ and threshold voltage of $V_{kP}$ $234_3$, and a negative boost amplifier $216_3$ having an associated bias current of $I_{biasN}$ $226_3$ and threshold voltage of $V_{kN}$ $236_3$. In some cases, as discussed herein, the foregoing bias currents and threshold voltages can be generated using fixed bias current sources and fixed voltage sources, respectively. In such cases, the currents and/or voltages generated by such fixed sources might exhibit variations due to uncertainties in the manufacturing process associated with certain implementations (e.g., as a semiconductor integrated circuit or IC) of the linear amplifier 502. The linear range extension control technique 5A00 can address such variations and/or uncertainties using controllable sources. Specifically, in one or more embodiments, the foregoing bias currents and/or threshold voltages can be controlled by a set of controlled current and voltage sources (e.g., controlled sources 504) and a control module 506. For example, the bias currents, threshold voltages, and/or other controlled attributes of the implementations of the herein disclosed techniques might be adjusted to improve certain performance characteristics exhibited by linear amplifiers with extended linear output range and/or compensate for variations in the manufacturing process (e.g., process variations during IC fabrication) of various implementations of such linear amplifiers with extended linear output range. Other purposes for the linear range extension control technique 5A00 are possible.

In some cases, as shown, the aforementioned bias currents (e.g., $I_{biasM}$ $222_3$, $I_{biasP}$ $224_3$, and $I_{biasN}$ $226_3$) might have a corresponding controlled current source (e.g., controlled current source $512_1$, controlled current source $512_2$, and controlled current source $512_3$, respectively) included in the controlled sources 504. Further, the aforementioned threshold voltages (e.g., $V_{kP}$ $234_3$ and $V_{kN}$ $236_3$) might have a corresponding controlled voltage source (e.g., controlled voltage source $514_1$ and controlled voltage source $514_2$, respectively) included in the controlled sources 504. In such cases, the control module 506 might receive a set of adjustment signals 532 comprising one or more signals from the linear amplifier 502 and/or the controlled sources 504 and/or various instances of off-chip sources 508, to determine one or more control signals 534 for controlling the controlled sources 504. For example, certain instances of the adjustment signals 532 from the linear amplifier might represent current measurements and/or voltage measurements from various test points within the linear amplifier. Further, instances of the adjustment signals 532 from the controlled sources 504 might represent currents and/or voltages generated based on the then current control settings. As another example, instances of the adjustment signals 532 from the off-chip sources 508 might represent certain manufacturing process monitor results. More specifically, such process monitor results might be derived from DC and/or RF measurements (e.g., resistance measurements, ring oscillator frequency measurements, capacitance measurements, etc.) of certain test structures on a fabricated wafer. In some cases, the adjustment signals from off-chip sources 508 might comprise digital words (e.g., 16-bit setting from an EEPROM, serial data from an I2C bus, etc.) that can be used to generate various instances of control signals 534. The settings might also be stored in ROM, PROM, and/or other storage facilities on the same chip comprising the linear amplifier 502 and/or a higher order system comprising the linear amplifier 502.

The adjustment signals 532 can be received and/or processed by the control module 506 using various techniques. Specifically, the adjustment signals 532 might be received by one or more instances of sensors 530 to be converted to signals that can be interpreted by a set of control logic 524. For example, the sensors 530 might comprise one or more analog-to-digital converters (ADCs) and/or comparators that can detect if a certain instance of the adjustment signals 532 is within a given tolerance and/or range. Based on the response delivered by the sensors 530, the control logic 524 might invoke other components to determine one or more instances of the control signals 534 to deliver to the controlled sources 504 for adjusting certain controlled attributes of the linear amplifier 502. For example, the control logic 524 might use a lookup table 522 to determine a new adjustable resistance setting for a controlled voltage source based on a fabrication resistance variation indicated by adjustment signals received from one of the off-chip sources 508. In some cases, the lookup table 522 might be generated using sensitivity analysis results from simulations of the linear amplifier 502 across various process corners. As another example for controlling the linear amplifier 502, the control logic 524 might use a current digital-to-analog converter (DAC) from the DACs 526 to adjust a controlled current source based on a bias current measurement received from the linear amplifier 502. In some cases, certain instances of a set of controlled references 528 (e.g., current references, voltage references, etc.) can be used by the control module 506 and/or the controlled sources 504 to establish various adjustments.

As described herein, the linear range extension control technique 5A00 can be implemented as a "closed loop" system (e.g., real-time adjustment signals received to dynamically generate control signals), or an "open loop" system (e.g., one-time adjustment signals received to generate a set of control signals), to perform adjustments to the linear amplifier 502. One embodiment of a technique for performing such adjustments is described in FIG. 5B.

Figure 5B:
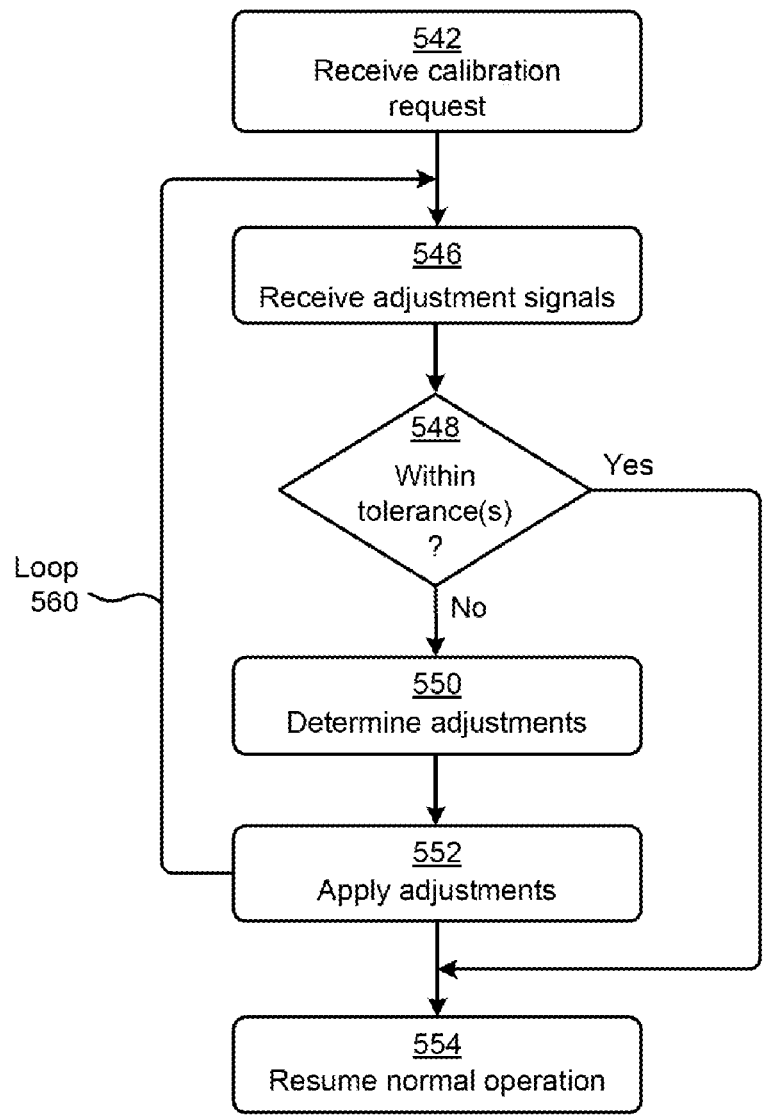
FIG. 5B presents a flow diagram illustrating a linear range extension adjustment technique as used to implement a linear amplifier with extended linear output range, according to an embodiment.

FIG. 5B presents a flow diagram illustrating a linear range extension adjustment technique 5B00 as used to implement a linear amplifier with extended linear output range, according to an embodiment. As an option, one or more instances of linear range extension adjustment technique 5B00 or any aspect thereof may be implemented in the context of the architecture and functionality of the embodiments described herein. Also, the linear range extension adjustment technique 5B00 or any aspect thereof may be implemented in any desired environment.

The linear range extension adjustment technique 5B00 presents one embodiment of certain steps for performing adjustments to linear amplifiers with extended linear output ranges as implemented using the herein disclosed techniques. In one or more embodiments the steps and underlying operations shown in the linear range extension adjustment technique 5B00 can be executed by the components described in FIG. 5A and/or other components.

Specifically, the linear range extension adjustment technique 5B00 can commence with receiving a calibration request to calibrate and/or adjust certain attributes associated with an extended range linear amplifier (see step 542). For example, initial power up of a system (e.g., fiber optic transmitter) comprising one or more extended range linear amplifiers might invoke a calibration request (e.g., indicated by a trigger signal, a processor command, etc.) to check certain attributes and/or settings of the linear amplifiers. In such cases, one or more adjustment signals (e.g., from the linear amplifiers, control circuitry, off-chip sources, etc.) can be received (see step 546). If the received adjustment signals are within certain tolerances (see "Yes" path of decision 548) normal operation of the linear amplifier can be started and/or resumed (see step 554). Such normal operation of the linear amplifier can continue until another instance of the calibration request is detected. For example, a calibration request might be invoked during normal operation after a certain time delay, responsive to a power rail glitch, and/or based on other criteria.

When one or more of the received adjustment signals indicate some attribute is outside acceptable tolerances (see "No" path of decision 548), certain adjustments can be determined responsive to the controlled attributes not within tolerance (see step 550). For example, an adjustment to a resistor in a controlled voltage source might bring a boost amplifier threshold voltage (e.g., sensed via an adjustment signal) within target tolerances. As another example, a new setting for a current DAC (e.g., received from an off-chip source) might be used to adjust the allocation of the bias current among the main amplifier and the boost amplifiers. When the adjustments are determined, the adjustments can be applied (e.g., resistor selection programmed, current DAC programmed, etc.) (see step 552). In some cases, the process can return (see loop 560) to sensing another instance of the adjustment signals (see step 546) and continue until the linear amplifier controlled attributes are within tolerance. In such cases, a timeout value might be established to handle the exception of certain controlled attributes not converging to a value within its associated tolerance. In other cases, a one-time adjustment can be applied, followed by a return to normal operation (e.g., no loop 560).

ADDITIONAL EMBODIMENTS OF THE DISCLOSURE

Figure 6:
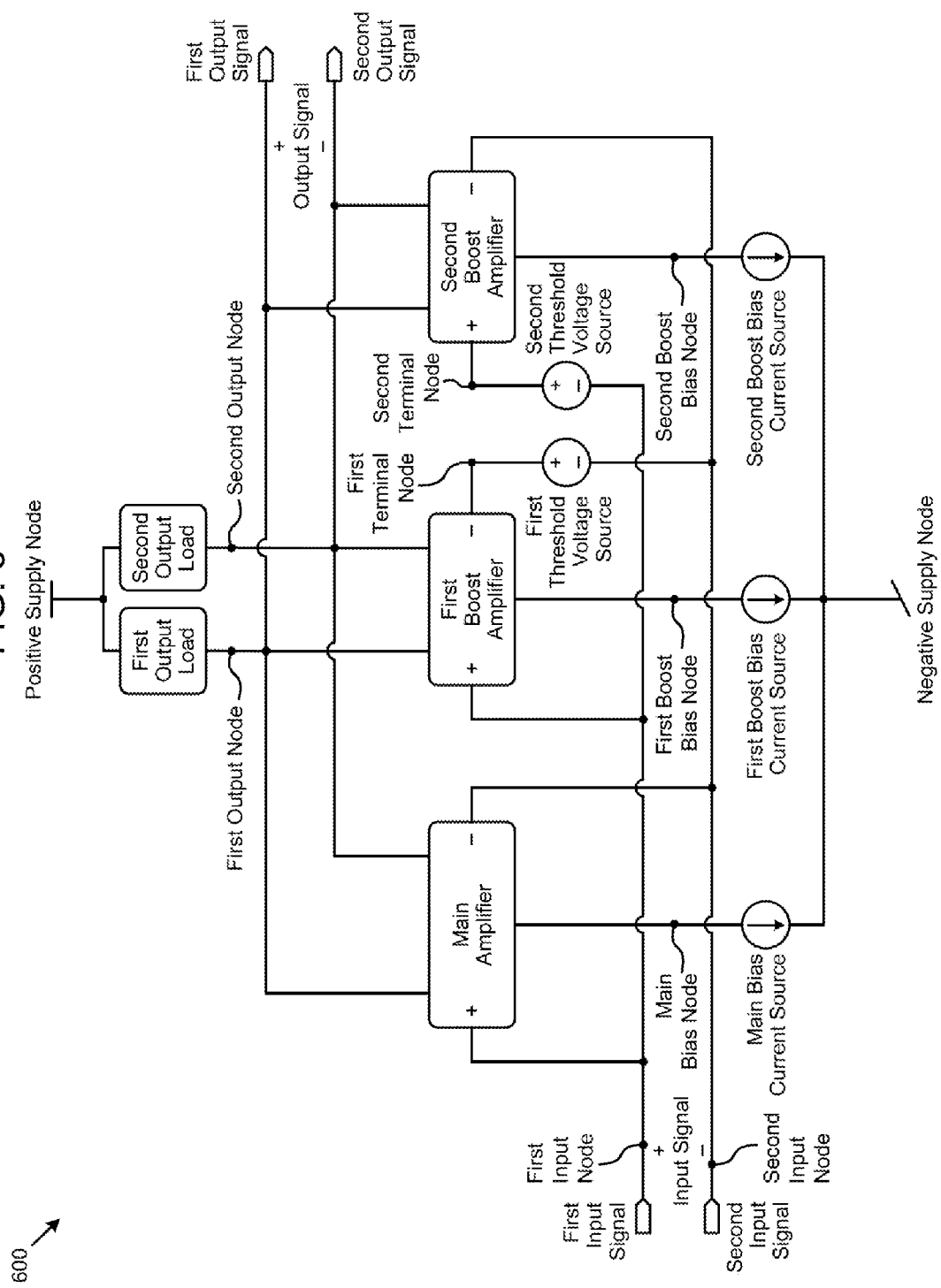
FIG. 6 is a diagram of a linear amplifier with extended linear output range, according to an embodiment.

FIG. 6 is a diagram 600 of a linear amplifier with extended linear output range. As an option, one or more instances of diagram 600 or any aspect thereof may be implemented in the context of the architecture and functionality of the embodiments described herein. Also, the diagram 600 or any aspect thereof may be implemented in any desired environment.

Shown in diagram 600 is an amplifier comprising: a first input node to receive a first input signal; a second input node to receive a second input signal, wherein an input signal received by the amplifier is derived from a first difference between the first input signal and the second input signal; a first output node to present a first output signal; a second output node to present a second output signal, wherein an output signal generated by the amplifier is derived from a second difference between the first output signal and the second output signal; a main bias current source coupled to a main bias node, the main bias current source providing a main bias current at the main bias node; a first boost bias current source coupled to a first boost bias node, the first boost bias current source providing a first boost bias current at the first boost bias node; a second boost bias current source coupled to a second bias node, the second boost bias current source providing a second boost bias current at the second boost bias node; a first threshold voltage source coupled to a first terminal node and the second input node, the first threshold voltage source providing a first threshold voltage between the first terminal node and the second input node; a second threshold voltage source coupled to a second terminal node and the first input node, the second threshold voltage source providing a second threshold voltage between the second terminal node and the first input node; a main amplifier coupled to the first input node, the second input node, the first output node, the second output node, and the main bias node to produce a first portion of the output signal; a first boost amplifier coupled to the first input node, the negative terminal node, the first output node, the second output node, and the first boost bias node to produce a second portion of the output signal; and a second boost amplifier coupled to the positive terminal node, the second input node, the first output node, the second output node, and the second boost bias node to produce a third portion of the output signal wherein the first boost amplifier and the second boost amplifier facilitate extending a linear range of the output signal.

In certain embodiments, the amplifier further comprises: a positive supply node; a first output load coupled to the positive supply node and the first output node; and a second output load coupled to the positive supply node and the second output node.

Figure 7:
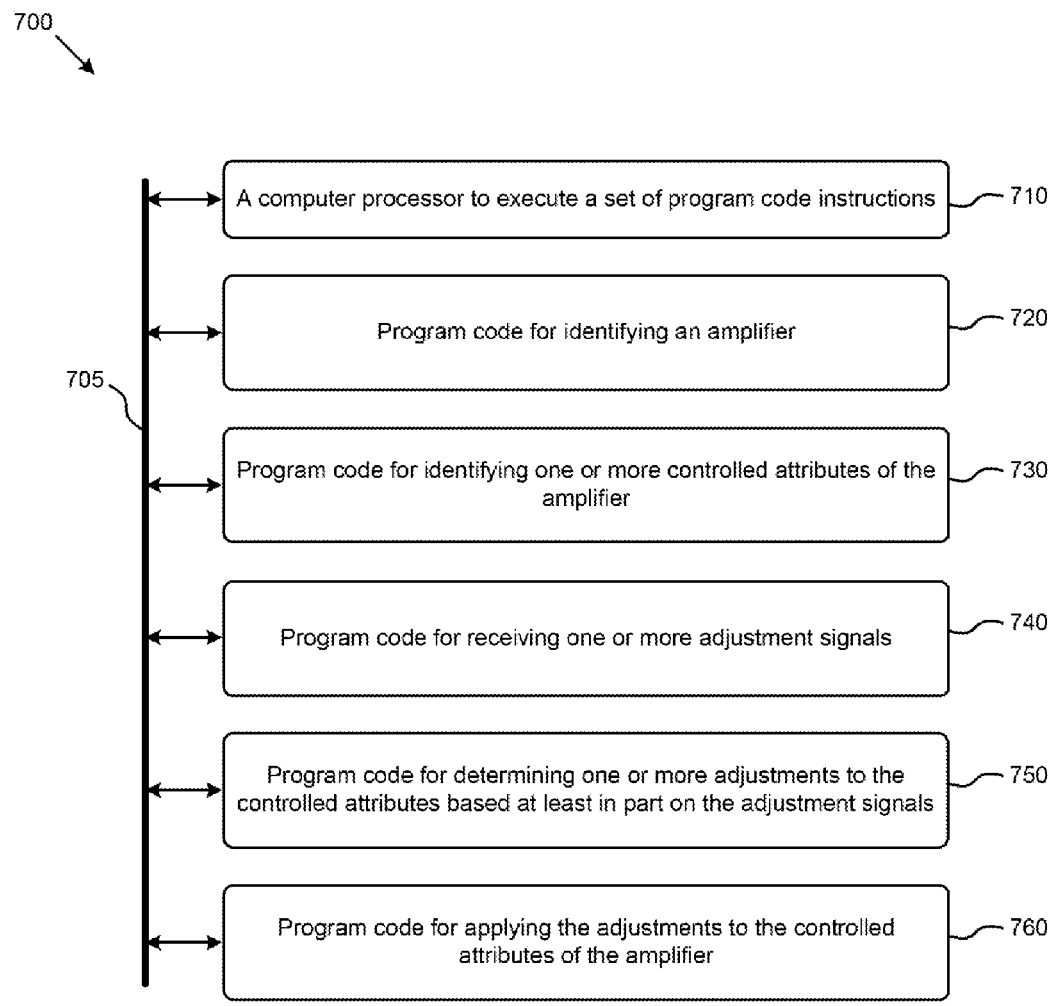
FIG. 7 is a block diagram of a system for an adjustable linear amplifier with extended linear output range, according to an embodiment.

FIG. 7 is a block diagram of a system 700 for an adjustable linear amplifier with extended linear output range, according to some embodiments. As an option, the system 700 may be implemented in the context of the architecture and functionality of the embodiments described herein. Of course, however, the system 700 or any operation therein may be carried out in any desired environment. The system 700 comprises at least one processor and at least one memory, the memory serving to store program instructions corresponding to the operations of the system. As shown, an operation can be implemented in whole or in part using program instructions accessible by a module. The modules are connected to a communication path 705, and any operation can communicate with other operations over communication path 705. The modules of the system can, individually or in combination, perform method operations within system 700. Any operations performed within system 700 may be performed in any order unless as may be specified in the claims. The shown embodiment implements a portion of a computer system, presented as system 700, comprising a computer processor to execute a set of program code instructions (see module 710) and modules for accessing memory to hold program code instructions to perform: identifying an amplifier (see module 720); identifying one or more controlled attributes of the amplifier (see module 730); receiving one or more adjustment signals (see module 740); determining one or more adjustments to the controlled attributes based at least in part on the adjustment signals (see module 750); and applying the adjustments to the controlled attributes of the amplifier (see module 760).

Additional Examples

It should be noted that there are alternative ways of implementing the embodiments disclosed herein. Accordingly, the embodiments and examples presented herein are to be considered as illustrative and not restrictive, and the claims are not to be limited to the details given herein, but may be modified within the scope and equivalents thereof.

Additional System Architecture Examples

FIG. 8 depicts a block diagram of an instance of a computer system 800 suitable for implementing embodiments of the present disclosure. Computer system 800 includes a bus 806 or other communication mechanism for communicating information, which interconnects subsystems and devices such as a processor 807, a system memory (e.g., main memory 808, or an area of random access memory (RAM)), a static storage device (e.g., ROM 809), a storage device 810 (e.g., magnetic or optical), a data interface 833, a communication interface 814 (e.g., modem or Ethernet card), a display monitor 811 (e.g., CRT or LCD), input devices 812 (e.g., keyboard, cursor control, etc.), and an external data repository 831.

According to one embodiment of the disclosure, computer system 800 performs specific operations by processor 807 executing one or more sequences of one or more instructions contained in system memory. Such instructions may be read into system memory from another computer readable/usable medium such as a static storage device or a disk drive. In alternative embodiments, hard-wired circuitry may be used in place of, or in combination with, software instructions to implement the disclosure. Thus, embodiments of the disclosure are not limited to any specific combination of hardware circuitry and/or software. In one embodiment, the term "logic" shall mean any combination of software or hardware that is used to implement all or part of the disclosure.

The term "computer readable medium" or "computer usable medium" as used herein refers to any medium that participates in providing instructions to processor 807 for execution. Such a medium may take many forms including, but not limited to, non-volatile media and volatile media. Non-volatile media includes, for example, optical or magnetic disks such as disk drives or tape drives. Volatile media includes dynamic memory such as a RAM memory.

Common forms of computer readable media includes, for example, floppy disks, flexible disks, hard disks, magnetic tape, or any other magnetic medium; CD-ROM or any other optical medium; punch cards, paper tape, or any other physical medium with patterns of holes; RAM, PROM, EPROM, FLASH-EPROM, or any other memory chip or cartridge; or any other non-transitory medium from which a computer can read data.

In an embodiment of the disclosure, execution of the sequences of instructions to practice the disclosure is performed by a single instance of the computer system 800. According to certain embodiments of the disclosure, two or more instances of computer system 800 coupled by a communications link 815 (e.g., LAN, PTSN, or wireless network) may perform the sequence of instructions required to practice the disclosure in coordination with one another.

Computer system 800 may transmit and receive messages, data and instructions, including programs (e.g., application code), through communications link 815 and communication interface 814. Received program code may be executed by processor 807 as it is received and/or stored in storage device 810 or any other non-volatile storage for later execution. Computer system 800 may communicate through a data interface 833 to a database on the external data repository 831. Data items in the database can be accessed using a primary key (e.g., a relational database primary key). A module as used herein can be implemented using any mix of any portions of the system memory and any extent of hard-wired circuitry including hard-wired circuitry embodied as a processor 807.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. An amplifier comprising:
 a first input node to receive a first input signal;
 a second input node to receive a second input signal, wherein an input signal received by the amplifier is derived from a first difference between the first input signal and the second input signal;
 a first output node to present a first output signal;
 a second output node to present a second output signal, wherein an output signal generated by the amplifier is derived from a second difference between the first output signal and the second output signal;
 a main bias current source coupled to a main bias node, the main bias current source providing a main bias current at the main bias node;
 a first boost bias current source coupled to a first boost bias node, the first boost bias current source providing a first boost bias current at the first boost bias node;
 a second boost bias current source coupled to a second boost bias node, the second boost bias current source providing a second boost bias current at the second boost bias node;
 a first threshold voltage source coupled to a first terminal node and the second input node, the first threshold voltage source providing a first threshold voltage between the first terminal node and the second input node;
 a second threshold voltage source coupled to a second terminal node and the first input node, the second threshold voltage source providing a second threshold voltage between the second terminal node and the first input node;
 a main amplifier coupled to the first input node, the second input node, the first output node, the second output node, and the main bias node to produce a first portion of the output signal;
 a first boost amplifier coupled to the first input node, the first terminal node, the first output node, the second output node, and the first boost bias node to produce a second portion of the output signal; and
 a second boost amplifier coupled to the second terminal node, the second input node, the first output node, the second output node, and the second boost bias node to produce a third portion of the output signal;

wherein the first boost amplifier and the second boost amplifier facilitate extending a linear range of the output signal.

2. The amplifier of claim 1, wherein at least one of, the main amplifier, the first boost amplifier, or the second boost amplifier, is a differential pair amplifier.

3. The amplifier of claim 2, wherein the differential pair amplifier comprises two bipolar junction transistors.

4. The amplifier of claim 1, wherein the main amplifier is a degenerated differential pair amplifier.

5. The amplifier of claim 1, wherein the at least one of, the first boost bias current, or the second boost bias current, is related to the main bias current by a scaling factor.

6. The amplifier of claim 1, wherein the at least one of, the main bias current source, the first boost bias current source, or the second boost bias current source, is a controlled current source.

7. The amplifier of claim 1, wherein the at least one of, the first threshold voltage source, or the second threshold voltage source, is a controlled voltage source.

8. The amplifier of claim 1, further comprising:
 a positive supply node;
 a first output load coupled to the positive supply node and the first output node; and
 a second output load coupled to the positive supply node and the second output node.

9. A system to control an amplifier, the system comprising:
 one or more bias currents associated with the amplifier;
 one or more threshold voltages associated with the amplifier;
 one or more controlled sources corresponding to at least one of, the bias currents, or the threshold voltages; and
 a control module to control the controlled sources to adjust at least one of, the bias currents, or the threshold voltages,
 wherein the control module receives one or more adjustment signals to determine at least one adjustment to apply to a respective one of the controlled sources.

10. The system of claim 9, wherein the adjustment signals are received from at least one of, the amplifier, the controlled sources, or one or more off-chip sources.

11. The system of claim 9, wherein the adjustment signals are based at least in part on one of, a voltage measurement, a current measurement, a resistance measurement, a capacitance measurement, a frequency measurement, or a process variation.

12. The system of claim 9, wherein the controlled sources comprise at least one of, a controlled current source, or a controlled voltage source.

13. The system of claim 9, wherein the control module delivers one or more control signals to the controlled sources.

14. A system to control an amplifier, the system comprising:
 one or more bias currents associated with the amplifier;
 one or more threshold voltages associated with the amplifier;
 one or more controlled sources corresponding to at least one of, the bias currents, or the threshold voltages; and
 a control module to control the controlled sources to adjust at least one of, the bias currents, or the threshold voltages,
 wherein the control module comprises at least one of, a set of control logic, one or more sensors, one or more controlled references, one or more DACs, or a lookup table.

15. A method to control an amplifier, the method comprising:
- identifying the amplifier;
- identifying one or more controlled attributes of the amplifier;
- receiving one or more adjustment signals;
- determining one or more adjustments to the controlled attributes based at least in part on the adjustment signals; and
- applying the adjustments to the controlled attributes of the amplifier
- wherein determining the adjustments is based at least in part on one or more tolerances.

16. The method of claim 15, wherein the controlled attributes are associated with at least one of, a controlled current source, or a controlled voltage source.

17. The method of claim 15, wherein the controlled attributes correspond to at least one of, a bias current, or a threshold voltage.

18. A method to control an amplifier, the method comprising:
- identifying the amplifier;
- identifying one or more controlled attributes of the amplifier;
- receiving one or more adjustment signals;
- determining one or more adjustments to the controlled attributes based at least in part on the adjustment signals;
- applying the adjustments to the controlled attributes of the amplifier; and
- invoking a calibration request to enable receiving the adjustment signals.

* * * * *